US006653760B1

(12) United States Patent
Goodson

(10) Patent No.: US 6,653,760 B1
(45) **Date of Patent: *Nov. 25, 2003**

(54) ULTRASONIC TRANSDUCER USING THIRD HARMONIC FREQUENCY

(75) Inventor: J. Michael Goodson, Skillman, NJ (US)

(73) Assignee: Crest Ultrasonics Corporation, Trenton, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 09/159,047

(22) Filed: Sep. 23, 1998

Related U.S. Application Data

(63) Continuation-in-part of application No. 08/792,568, filed on Jan. 31, 1997, which is a continuation-in-part of application No. 08/853,423, filed on May 9, 1997, which is a continuation-in-part of application No. 08/644,843, filed on May 9, 1996, now Pat. No. 5,748,566.

(60) Provisional application No. 60/038,961, filed on Feb. 24, 1997, and provisional application No. 60/039,228, filed on Feb. 28, 1997.

(51) Int. Cl.[7] .................... H01L 41/08

(52) U.S. Cl. .................... 310/325; 310/334

(58) Field of Search .................... 310/323.01, 328, 310/325, 317, 334

(56) References Cited

U.S. PATENT DOCUMENTS

| | | | | | |
|---|---|---|---|---|---|
| 2,998,535 | A | | 8/1961 | Church et al. | 310/8.3 |
| 3,187,207 | A | | 6/1965 | Tomes | 310/8.7 |
| 3,371,233 | A | * | 2/1968 | Cook | 310/334 |
| 3,390,287 | A | | 6/1968 | Sonderegger | 318/9.6 |
| 3,433,462 | A | * | 3/1969 | Cook | 310/334 |
| 3,575,383 | A | | 4/1971 | Coleman | 259/72 |
| 3,777,189 | A | | 12/1973 | Skinner et al. | 310/8.3 |
| 3,935,484 | A | | 1/1976 | Leschek et al. | 318/8.2 |
| 3,937,990 | A | | 2/1976 | Winston | 310/8.3 |
| 4,129,850 | A | | 12/1978 | Mumper | 340/10 |
| 4,193,009 | A | | 3/1980 | Durley, III | 310/323 |
| 4,219,889 | A | | 8/1980 | Parssinen | 367/158 |
| 4,602,184 | A | | 7/1986 | Meitzler | 310/322 |
| 4,633,119 | A | | 12/1986 | Thompson | 310/325 |
| 4,798,990 | A | | 1/1989 | Henoch | 310/334 |
| 5,376,860 | A | | 12/1994 | Sato | 310/346 |
| 5,748,566 | A | | 5/1998 | Goodson | 367/158 |
| 5,834,871 | A | * | 11/1998 | Puskas | 310/325 X |

FOREIGN PATENT DOCUMENTS

| | | |
|---|---|---|
| GB | 1331100 | 9/1973 |
| JP | 58-50898 | 3/1983 |

* cited by examiner

*Primary Examiner*—Mark O. Budd
(74) *Attorney, Agent, or Firm*—Stallman & Pollock LLP

(57) ABSTRACT

An ultrasonic transducer is disclosed that operates efficiently and at low impedance at high frequencies at or near a third harmonic frequency of its piezoelectric crystal. The ultrasonic transducer includes a resonator composed of ceramic material and positioned between a head mass and the piezoelectric crystal.

4 Claims, 8 Drawing Sheets

ULTRASONIC TRANSDUCER USING THIRD HARMONIC FREQUENCY

RELATED APPLICATIONS

This application is a continuation-in-part of: co-pending application no. 08/792,568, filed Jan. 31, 1997, entitled ULTRASONIC TRANSDUCER, which was in turn a continuation-in-part of application Ser. No. 08/644,843, filed May 9, 1996, entitled ULTRASONIC TRANSDUCER (now U.S. Pat. No. 5,748,566, issued May 5, 1998); and co-pending application Ser. No. 08/853,423, filed May 9, 1997, entitled TRANSDUCER ASSEMBLY HAVING CERAMIC STRUCTURE, which claimed priority from 08/792,568, 08/644,843, 60/038,961 filed Feb. 24, 1997, and 60/039,228 filed Feb. 28, 1997. Each of these disclosures is expressly incorporated herein by reference.

BACKGROUND OF THE INVENTION

1.Field of the Invention

This invention relates to transducers which generate and transmit energy in the ultrasonic range, and relates more particularly to transducers using ceramic resonators and operating at third harmonic frequencies.

2.Description of the Relevant Art

Ultrasonic transducers are used for generating and transmitting wave energy of a predetermined frequency for ultrasonic cleaning or other uses. See, for example, U.S. Pat. No. 3,575,383 entitled ULTRASONIC CLEANING SYSTEM, APPARATUS AND METHOD THEREFOR. Transducers of this type can be used, for example, in ultrasonic cleaning equipment. The transducer is typically mounted to the side or the underside of a container which holds liquid, or mounted in a sealed enclosure which is immersed in a liquid in a container made of metal, plastic or glass. One or more transducers are used to energize the liquid with sonic energy. Once energized with the sonic energy, the liquid cavitates.

This type of transducer may be referred to as a "sandwich-type" transducer because it has a sandwich of a piezoelectric crystal in between two passive masses (head mass and tail mass). This type of transducer is also referred to as a "stacked" transducer because it has a stack of component elements. Typically, a head mass (or front driver) is the first component of the stack, the closest to the container or other object to which sonic energy is being transmitted. Then, one or more piezoelectric crystals are stacked onto the head mass, along with one or more electrodes to make electrical contact to the faces of the piezoelectric crystals. Then, a tail mass (or rear driver) is stacked onto the piezoelectric crystal (s), sometimes with electrical insulators to isolate the piezoelectric electrodes to prevent shorting out. These components are typically flat annular disks, with the head mass having a tapped hole. A bolt is inserted through the annulus of the stacked components and is threaded into the tapped hole in the head mass to compress the stack and hold it together.

An alternating current is supplied to the piezoelectric crystal, which expands and contracts. The vibrations of the piezoelectric crystal are transmitted through the head mass to the object being vibrated. Such transducers are used in applications like ultrasonic cleaning, plastic welding, wire bonding, cataract and other medical surgical devices, among others.

The head mass and tail mass are typically made from metals such as stainless steel, aluminum, and titanium.

Applicant has proposed using an additional element, called a resonator, between the head mass and the piezoelectric crystal(s) to enhance the output of the transducer relative to conventional transducers, as disclosed in prior patent applications 08/644,843, and 08/792,568. Ceramics, such as alumina (aluminum oxide) and silicon dioxide, are the preferred materials for the resonator.

A piezoelectric crystal has natural frequency that depends upon its size and vibration mode. For example, FIG. 1 illustrates the frequency response of a piezoelectric crystal that has a natural frequency at about 41.5 KHz. The plot shown in FIG. 1 has frequency from 10 KHz to 100 KHz plotted on the x-axis and impedance on a log scale to a maximum of 100 KΩ plotted on the y-axis. (These scales are also labelled on FIG. 1 at the lower right ("START" and "STOP" ) and upper left ("A MAX" )). A marker 10 is located at the minimum impedance, indicating a natural frequency of 41.5 KHz and an impedance of 45.2428 Ω.

The frequency of an ultrasonic transducer determines the frequency and corresponding size of the ultrasonic waves transmitted to the object. In a cleaning application, for example, a high frequency/short wavelength is needed for cleaning small parts. As the features of parts to be cleaned are reduced in size, higher frequencies/shorter wavelengths are needed so that the ultrasonic waves will be small enough to access those features. If the wavelengths are too big, the features are not reached by the ultrasonic waves. Thus, there is a need for higher frequency ultrasonic transducers for cleaning smaller sized parts.

One way to achieve higher frequencies is to reduce the size of the piezoelectric crystal. Reducing the size, however, has the disadvantage of reducing the amount of ultrasonic energy that can be generated by the piezoelectric crystal. What is needed is a way to increase frequency while maintaining an acceptable level of energy generation.

SUMMARY OF THE INVENTION

In accordance with the illustrated preferred embodiment, the present invention provides an improved ultrasonic transducer, and related method, capable of operating efficiently at high frequencies. The ultrasonic transducer of the present invention comprises a head mass, a resonator composed of ceramic material and positioned adjacent to the head mass, a piezoelectric crystal positioned adjacent to the resonator on a side opposite the head mass, a tail mass positioned adjacent to the piezoelectric crystal on a side opposite the resonator, and means for supplying electrical power to the piezoelectric crystal to oscillate the ultrasonic transducer at a third harmonic frequency. The method of using an ultrasonic transducer according to the present invention comprises the steps of providing an ultrasonic transducer having, in order, a head mass, a ceramic resonator, a piezoelectric crystal, and a tail mass in a stacked assembly; and supplying electrical power to the piezoelectric crystal at a frequency to cause the crystal to vibrate the transducer at a third harmonic frequency having low impedance.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter. For example, the term "harmonic frequency"

as used herein means a frequency at which the measured impedance of a piezoelectric crystal, either alone or as part of an ultrasonic transducer, has a minimum value. The term "first harmonic frequency" or "natural frequency" is the first frequency at which a significant minimum value of measured impedance first occurs as frequency increases from zero. The term "third harmonic frequency" is a frequency at which another significant minimum value of measured impedance occurs at or near three times the first harmonic frequency.

DETAILED DESCRIPTION OF THE PREFERRED EMBODIMENT

The Figures depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is an improved ultrasonic transducer, and related method, capable of operating efficiently at third harmonic frequencies. The ultrasonic transducer has a ceramic resonator positioned between a head mass and a piezoelectric crystal and operates at a third harmonic frequency.

Figure 1:
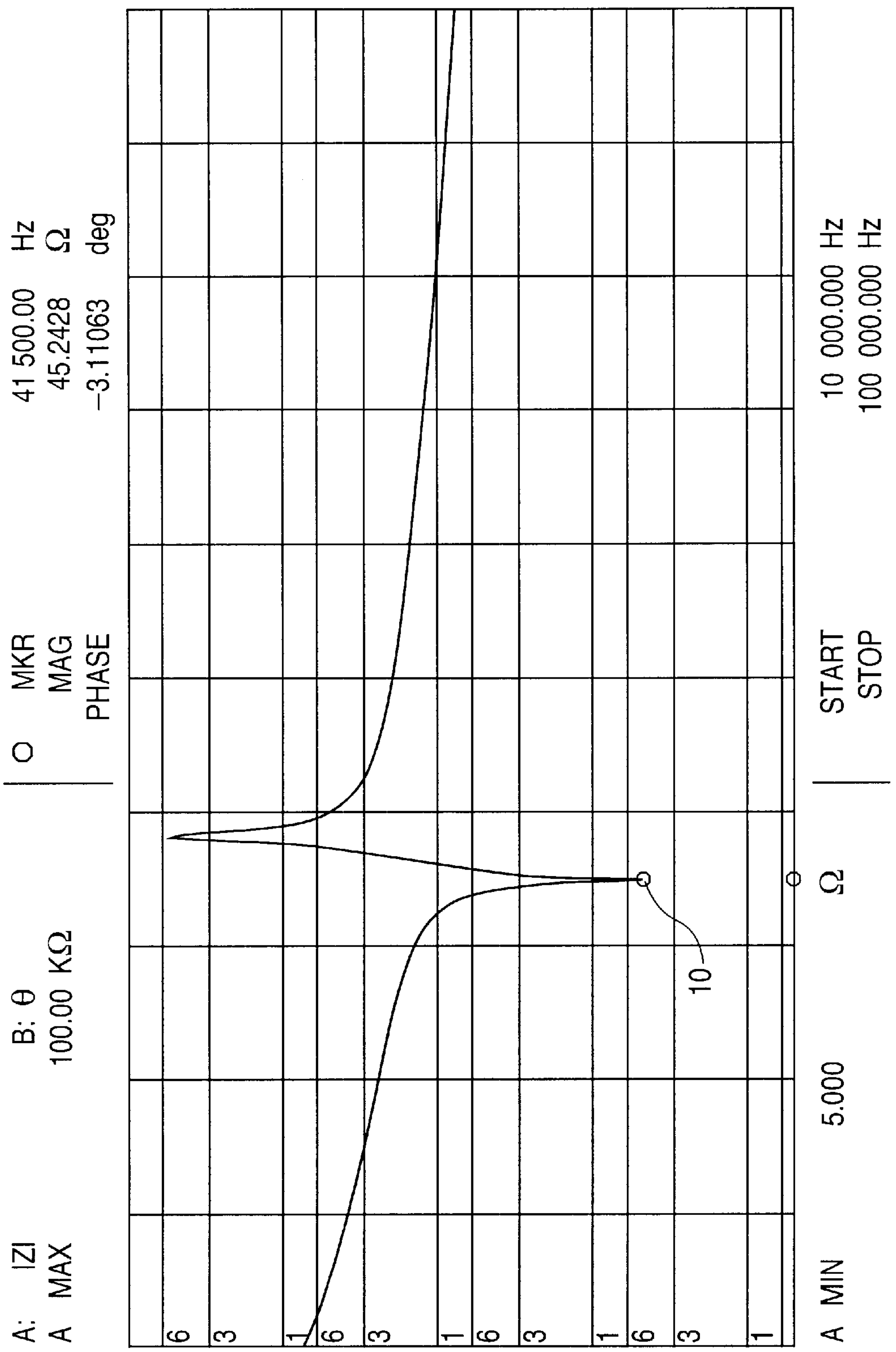
FIG. 1 is a frequency/impedance diagram illustrating a first harmonic frequency of a piezoelectric crystal.
Figure 2:
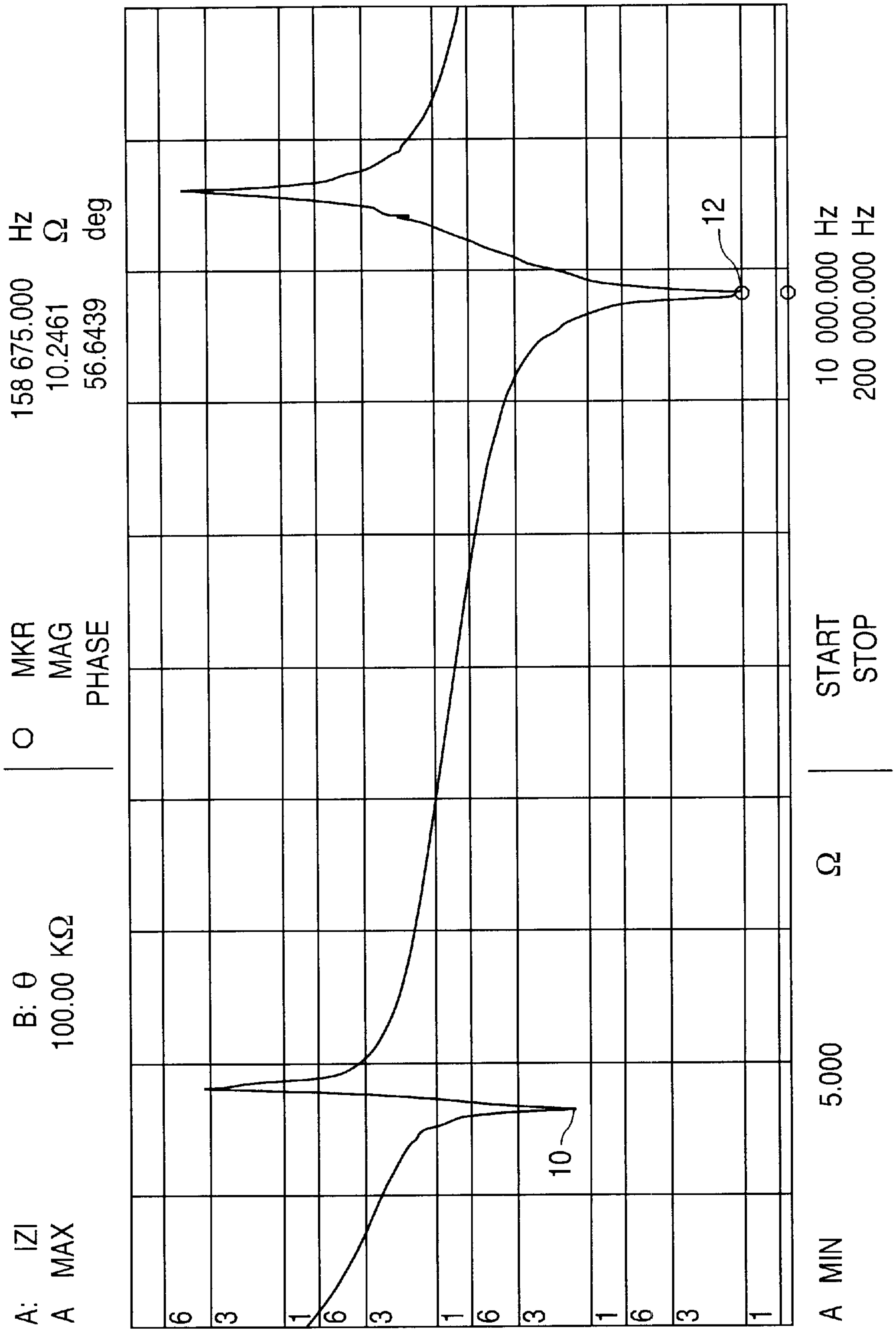
FIG. 2 is a frequency/impedance diagram illustrating the first and third harmonic frequencies of the piezoelectric crystal of FIG. 1.
Figure 3:
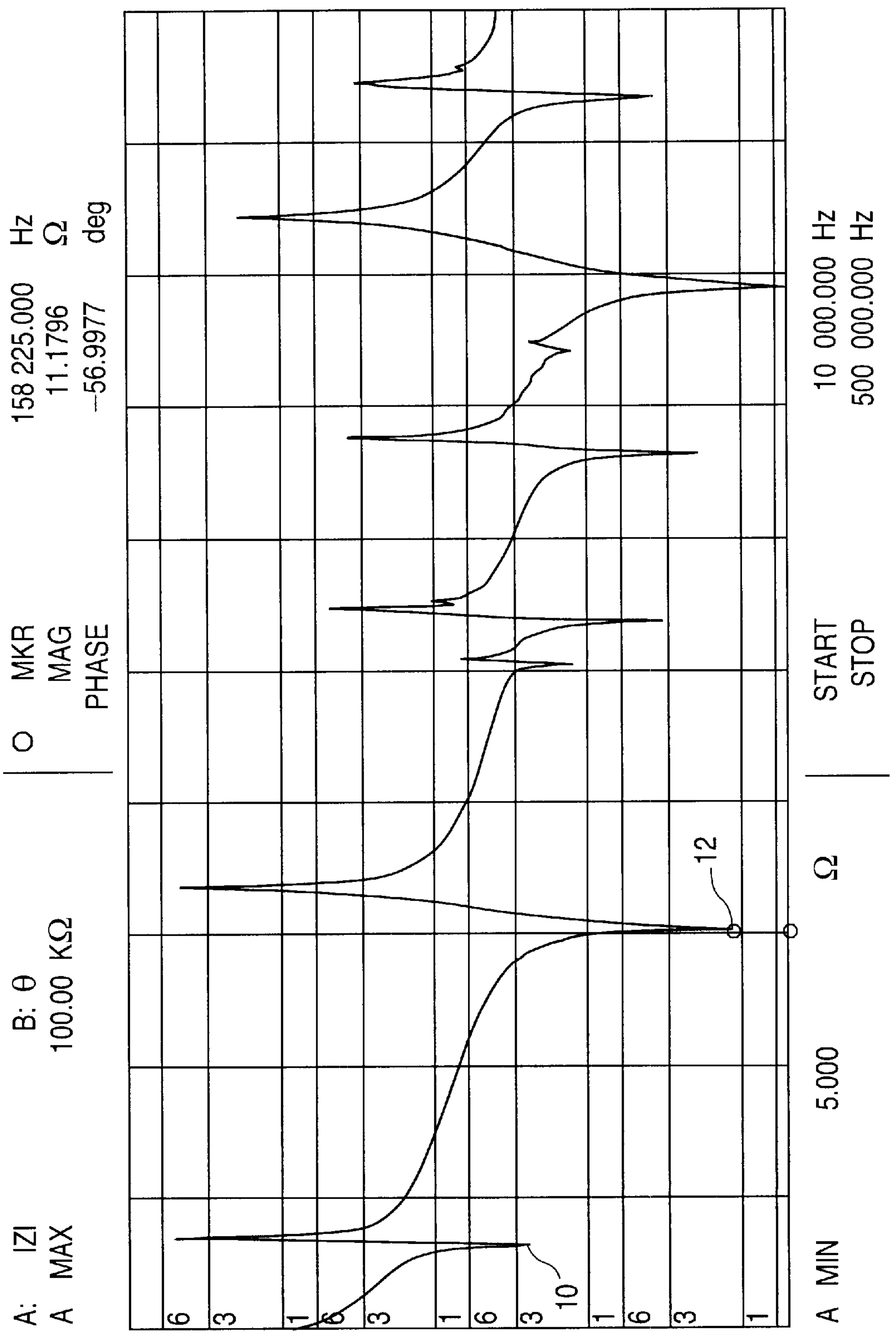
FIG. 3 is a frequency/impedance diagram illustrating several harmonic frequencies of the piezoelectric crystal of FIG. 1.

With the use of a ceramic resonator, it is possible to design and operate sandwich-type ultrasonic transducers using third harmonic frequencies (as well as other higher harmonics) of piezoelectric crystals. FIGS. 1–3 show the measured frequency response of a particular piezoelectric crystal, by itself and not as part of an ultrasonic transducer assembly. FIG. 1 shows a first harmonic 10 at a frequency of 41.5 KHz and impedance of 45.2428 Ω. FIG. 2 has an expanded frequency range, up to 200 KHz, and shows the first harmonic 10 and a third harmonic 12 of the same piezoelectric crystal. The frequency of the third harmonic 12 is 158.675 KHz and the measured impedance of the crystal is 10.2461 Ω. FIG. 3 has a further expanded frequency range, up to 500 KHz, and shows the first harmonic 10, third harmonic 12, and higher harmonics of the piezoelectric crystal. Low impedance is desired because it indicates efficient conversion of electrical energy into vibrations of the piezoelectric crystal.

Figure 4:
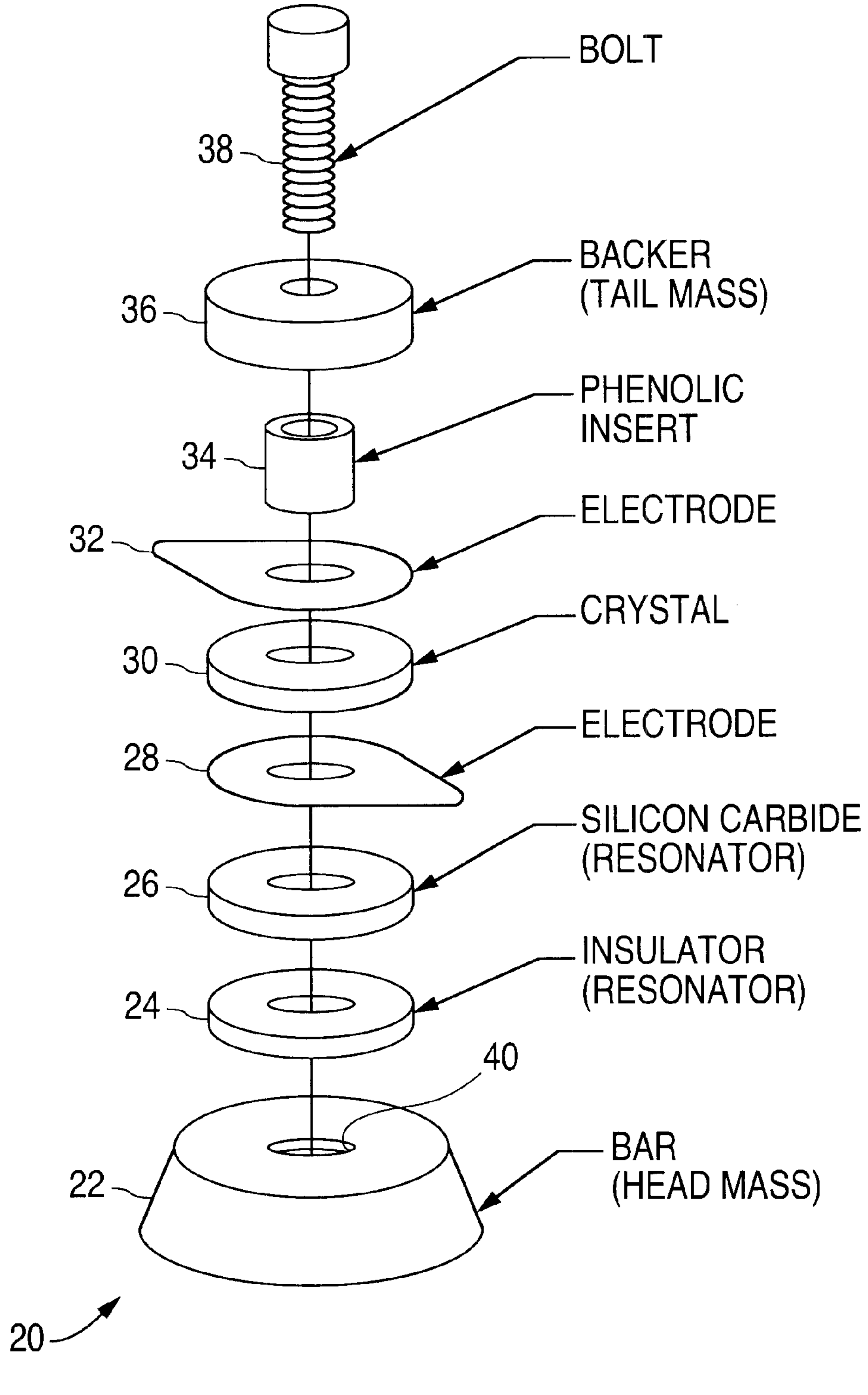
FIG. 4 is an exploded perspective view of an ultrasonic transducer according to one embodiment of the present invention, which includes two ceramic resonators and the piezoelectric crystal of FIG. 1.

FIG. 4 illustrates an ultrasonic transducer 20, according to the present invention, using the piezoelectric crystal 30 characterized in FIGS. 1–3, and FIG. 5 shows the resultant frequency response of the transducer. The transducer 20 has a head mass 22, a first resonator 24, a second resonator 26, the piezoelectric crystal 30 with two electrodes 28 and 32, an insulator 34, a tail mass 36, and a bolt 38, in a stacked assembly. The head mass 22 is metal and has a threaded blind hole 40 in one face. The first resonator 24 is ceramic, preferably alumina (aluminum oxide), and has an inner diameter of 625 inches, an outer diameter of 1.51 inches, and a thickness of 15 inches. The second resonator 26 is also ceramic, preferably silicon carbide, and has an inner diameter of 625 inches, an outer diameter of 1.51 inches, and a thickness of 20 inches. The piezoelectric crystal 30 has conductive faces that electrically contact the two electrodes 28 and 32. The piezoelectric crystal has an inner diameter of 625 inches, an outer diameter of 1.51 inches, and a thickness of 20 inches. The tail mass is composed of metal and has an inner and outer diameter that is the same as that of the resonators and piezoelectric crystal.

As can be seen from FIG. 4, the resonators 24 and 26 and piezoelectric crystal 30 are flat annular disks with central holes. The insulator 34, made of phenolic, fits within the central holes of the resonators and piezoelectric crystal to electrically isolate the piezoelectric crystal. The bolt 38 passes through the central holes of the components of the transducer and is threaded into the threaded hole 40 in the head mass. The bolt is tightened to compress the assembly. Electrical power (alternating current) is supplied to the two electrodes 28 and 32, causing the piezoelectric crystal to oscillate. The oscillations are transmitted through the resonators 24 and 26 and head mass 20 to a tank or other object (not shown).

Figure 5:
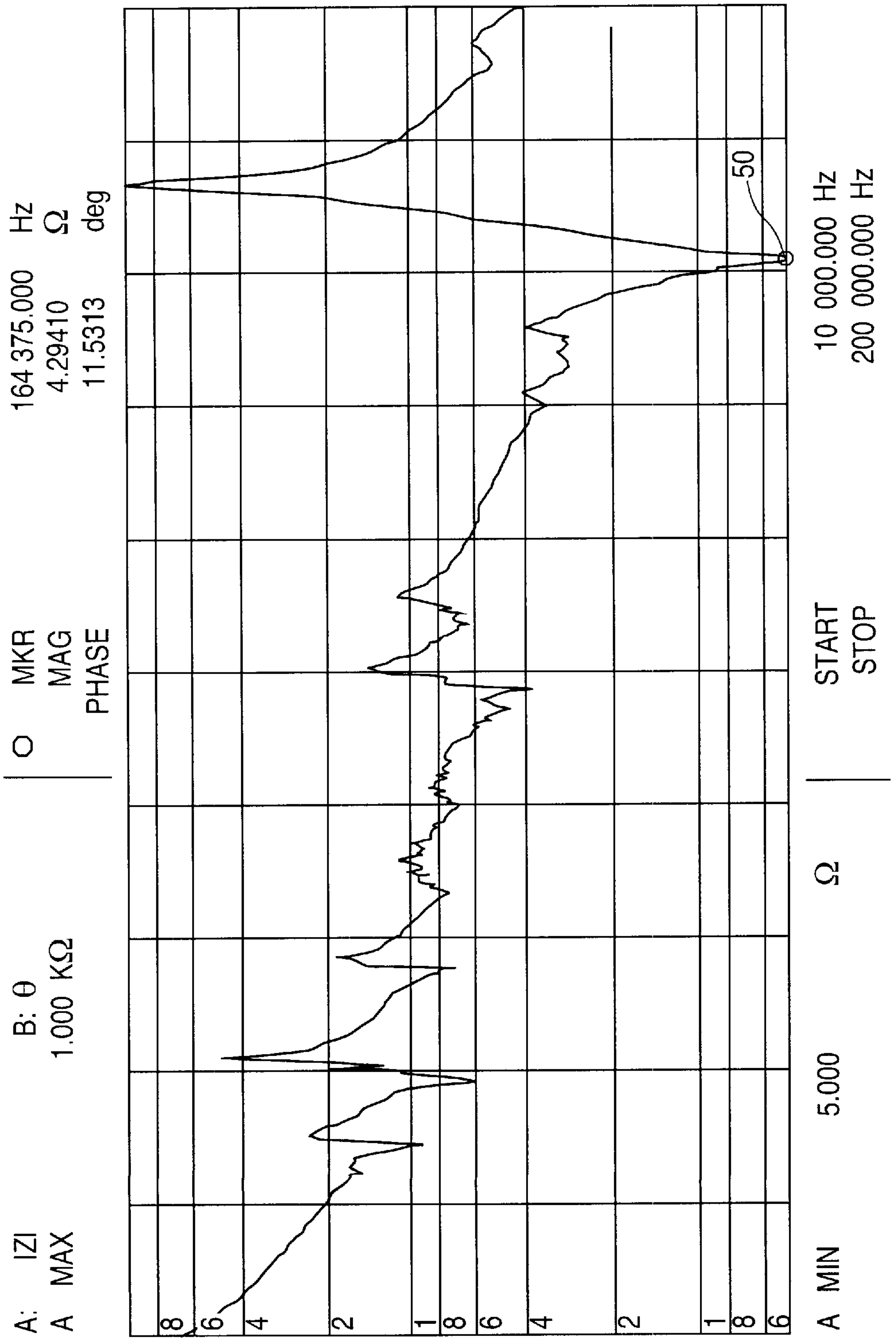
FIG. 5 is a frequency/impedance diagram of the ultrasonic transducer of FIG. 4.

The frequency response of the transducer 20 is shown in FIG. 5. Note that it does not have a well defined first harmonic, but has a very pronounced third harmonic 50. The frequency of the third harmonic 50 is 164.375 KHz and the impedance is 4.2941 Ω. In comparison with the piezoelectric crystal 30 alone (FIG. 2), the transducer 20 has a slightly higher third harmonic frequency and a lower and more advantageous impedance.

Figure 6:
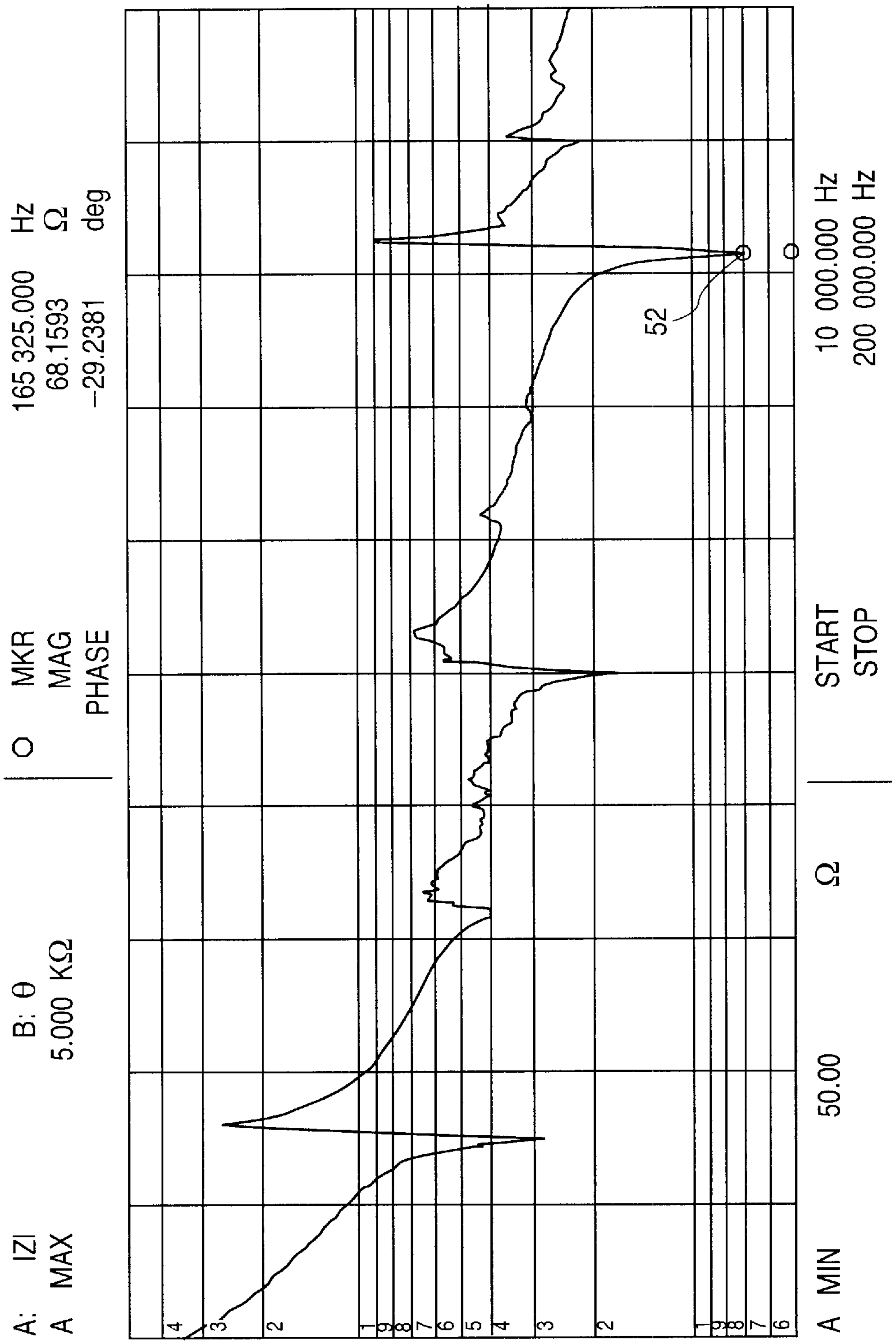
FIG. 6 is a frequency/impedance diagram of an ultrasonic transducer similar to that of FIG. 4 but without a ceramic resonator.

In order to observe the effect of the resonators 24 and 26 on the performance of the transducer 20, another transducer was assembled without the resonators. The frequency response of this transducer is shown in FIG. 6. It has a third harmonic frequency 52 at about the same frequency, 165.325 KHz, but a much higher impedance, 68.1593 Ω. (Note that the vertical scales of FIGS. 1–3, 5, and 6 are different.) Thus, the addition of the ceramic resonators 24 and 26 to the transducer has a very beneficial effect of creating a very distinct, low impedance, third harmonic frequency of operation.

The ultrasonic transducer 20 described above may be implemented in different forms, with different materials and constructions. For example, the transducer of the present invention may have only one ceramic resonator instead of the two shown in FIG. 4, or piezoelectric crystals have different dimensions and different natural frequencies. Such alternative constructions will likely have different frequency responses. Making and testing alternative constructions will show whether they have an advantageously low impedances at the third harmonic frequencies.

Figure 7:
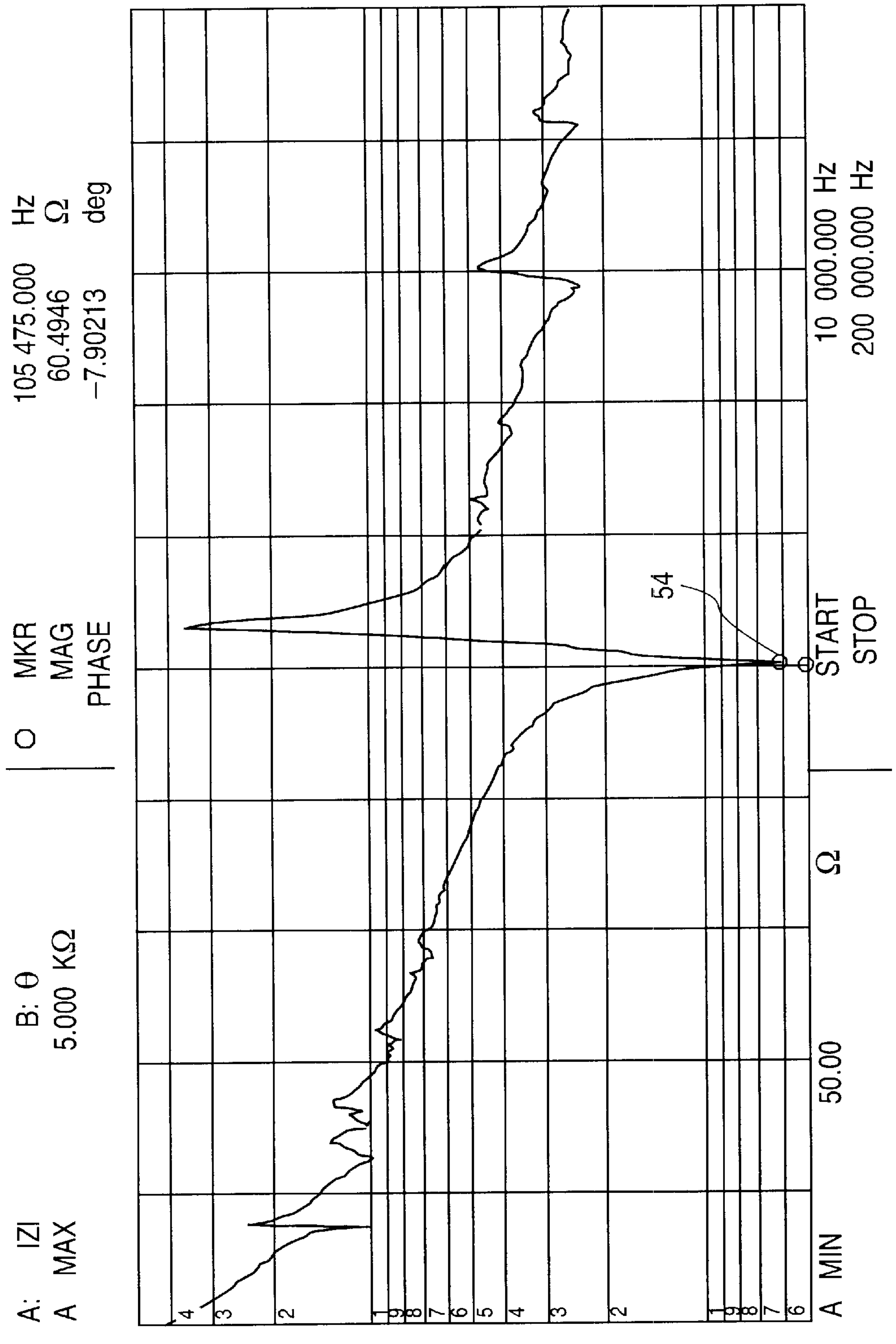
FIG. 7 is a frequency/impedance diagram of a second embodiment of an ultrasonic transducer according to the present invention.
Figure 8:
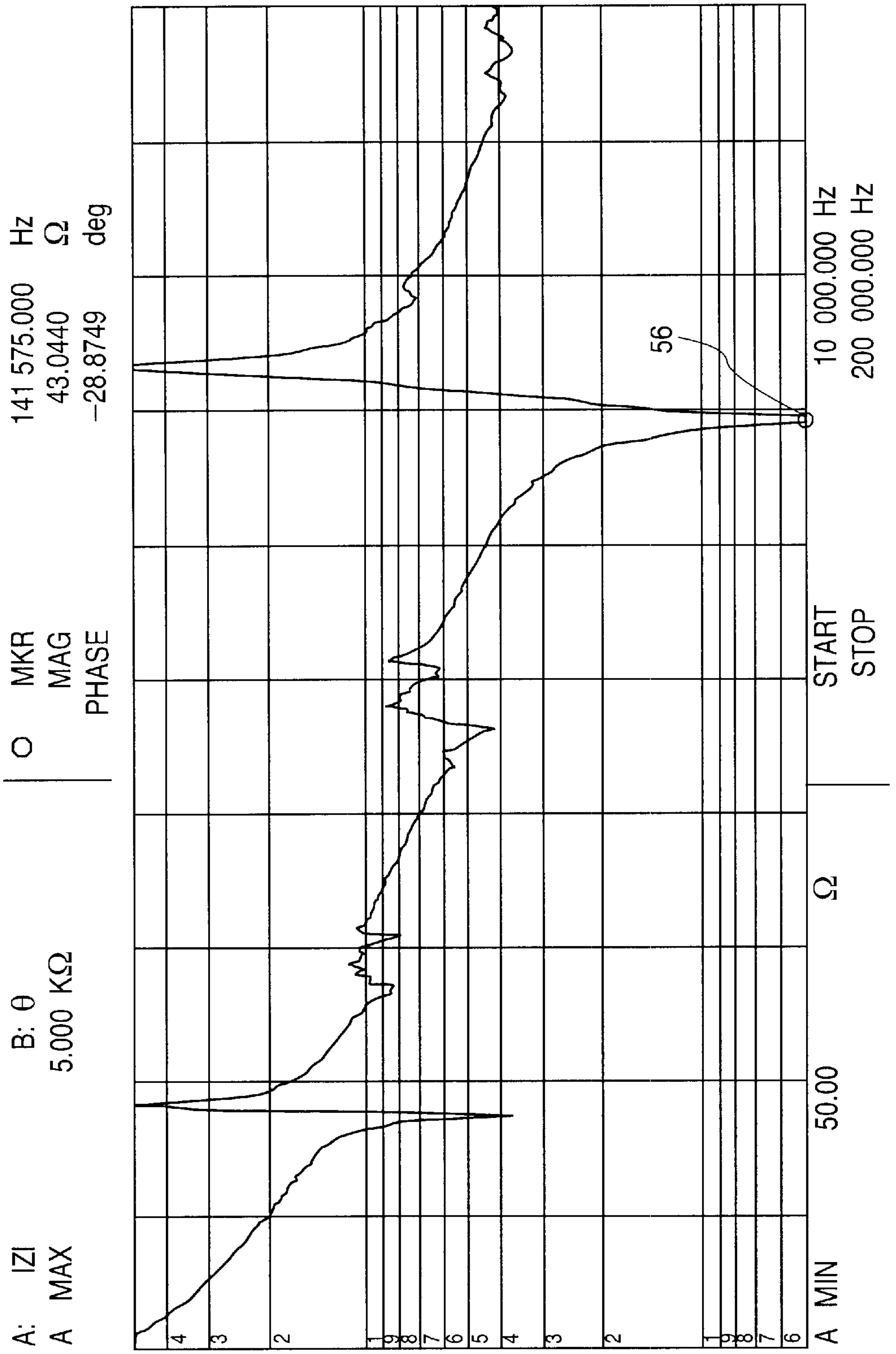
FIG. 8 is a frequency/impedance diagram of a third embodiment of an ultrasonic transducer according to the present invention.

The frequency response of two alternative constructions of the present invention are shown in FIGS. 7 and 8. The transducer of FIG. 7 has a measured impedance of 60.4946 Ω at a third harmonic frequency 54 of 105.475 KHz. This transducer is similar in construction to that of transducer 20 (FIG. 4), but with a piezoelectric crystal that has a first harmonic frequency of about 35 KHz, an outside diameter of 1.97 inches, an inner diameter of 59 inches and a thickness of 20 inches. It has a single resonator composed of alumina instead of two resonators. The resonator has the same inner and outer diameters as the piezoelectric crystal, and has a thickness of 15 inches.

The transducer of FIG. 8 has a measured impedance of 43.044 Ω at a third harmonic frequency 56 of 141.575 KHz. These measured impedances are not as low as that of FIG. 5, but may be low enough. This transducer is similar in construction to that of transducer 20 (FIG. 4), but with a piezoelectric crystal that has a first harmonic frequency of about 38.9 KHz, an outside diameter of 1.65 inches, and an inner diameter of 60 inches. It also has a single resonator composed of alumina. The resonator has the same inner and outer diameters as the piezoelectric crystal, and has a thickness of 15 inches.

The natural and third harmonic frequency of a piezoelectric crystal can be varied by varying its dimensions (inner and outer diameter and thickness). A larger piezoelectric crystal has a lower natural frequency. For example, an ultrasonic transducer according to the present invention having a third harmonic frequency of about 76 KHz can be made with a piezoelectric crystal having a 3.0 inch outer diameter, 60 inch inner diameter, and a 20 inch thickness and a natural frequency of about 20 KHz. A small piezoelectric crystal has a higher natural frequency. For example, an ultrasonic transducer according to the present invention having a third harmonic frequency of about 310 KHz can be made with a piezoelectric crystal having a 0.85 inch outer diameter, 40 inch inner diameter, and a 20 inch thickness and a natural frequency of about 68 KHz.

From the above description, it will be apparent that the invention disclosed herein provides a novel and advantageous ultrasonic transducer, and related method, capable of operating efficiently at third harmonic frequencies. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. An ultrasonic transducer comprising:

a head mass;

a resonator composed of ceramic material and positioned adjacent to the head mass;

a piezoelectric crystal positioned adjacent to the resonator on a side opposite the head mass for generating ultrasonic vibrations to be transmitted through the resonator and the head mass to a load;

a tail mass positioned adjacent to the piezoelectric crystal on a side opposite the resonator; and means for supplying electrical power to the piezoelectric crystal to oscillate the ultrasonic transducer at a third harmonic frequency;

wherein said resonator has two separate adjacent components, including a first resonator adjacent to the head mass and a second resonator adjacent to the piezoelectric crystal.

2. An ultrasonic transducer as recited in claim 1 wherein the first resonator is composed of alumina and the second resonator is composed of silicon carbide.

3. A method of using an ultrasonic transducer comprising the steps of:

providing an ultrasonic transducer having, in order a head mass, a ceramic resonator, a piezoelectric crystal, and a tail mass in a stacked assembly; and supplying electrical power to the piezoelectric crystal at a frequency to cause the crystal to vibrate the transducer at a third harmonic frequency having low impedance wherein the resonator and the head mass transmit ultrasonic vibrations to a load;

wherein said ceramic resonator has two separate adjacent components, including a first resonator adjacent to the bead mass and a second resonator adjacent to the piezoelectric crystal.

4. A method as recited in claim 3 wherein the first resonator is composed of alumina and the second resonator is composed of silicon carbide.

* * * * *